(12) United States Patent
Tsukamoto et al.

(10) Patent No.: US 6,381,020 B1
(45) Date of Patent: Apr. 30, 2002

(54) OPTICAL SYSTEM

(75) Inventors: Yoshio Tsukamoto, Chigasaki; Akira Kurachi, Tokyo, both of (JP)

(73) Assignee: Baldwin-Japan Ltd., Tokyo (JP)

( * ) Notice: Subject to any disclaimer, the term of this patent is extended or adjusted under 35 U.S.C. 154(b) by 0 days.

(21) Appl. No.: 09/292,469

(22) Filed: Apr. 15, 1999

(30) Foreign Application Priority Data

Apr. 15, 1998 (JP) ............................. 10-121858

(51) Int. Cl.$^7$ ............................................. G01N 21/55
(52) U.S. Cl. ............................................. 356/445
(58) Field of Search ........................ 356/445, 330–334, 356/446–448, 237.1, 402, 406–408; 250/225; 445/1, 22, 837, 838; 29/839; 228/180.1

(56) References Cited

U.S. PATENT DOCUMENTS 5,120,252 A  6/1992  Mayo et al. .................. 445/22
6,147,761 A  * 11/2000  Walowit et al. ............. 356/425

FOREIGN PATENT DOCUMENTS

DE  3841013  6/1990

OTHER PUBLICATIONS

Patent Abstracts of Japan, Publication No. 09293319, Published Nov. 11, 1997.
Patent Abstracts of Japan, Publication No. 09156080, Published Jun. 17, 1997.
Patent Abstracts of Japan, Publication No. 08160876, Published Jun. 21, 1996.
Patent Abstracts of Japan, Publication No. 07106627, Published Apr. 21, 1995.
Patent Abstracts of Japan, Publication No. 07029407, Published Jan. 31, 1995.

* cited by examiner

Primary Examiner—Frank G. Font
Assistant Examiner—Michael P. Stafira
(74) Attorney, Agent, or Firm—Morgan & Finnegan, LLP (57) ABSTRACT

There is disclosed an optical sensor comprising a holder provided on a circuit board. The holder has first and second cavity means formed therein. The optical sensor further comprises first body means including LEDs combined therewith for directing a light onto an object to illuminate the object with the light and generate a reflected light reflected from the object. The first body means is of a cassette type adapted to be fitted into and held in the first cavity means of the holder for removal. The first body means is electrically connected with the circuit board to complete a first electronic circuit through the LEDs when fitted into the first cavity means. The optical sensor further comprises second body means including photo detecting means combined therewith for receiving and detecting the reflected light reflected from the object. The second body means is of a cassette type adapted to be fitted into and held in the second cavity means of the holder for removal. The second body means is electrically connected with the circuit board to complete a second electronic circuit through the photo detecting means when fitted into the second cavity means.

29 Claims, 7 Drawing Sheets

OPTICAL SYSTEM

BACKGROUND OF THE INVENTION

1. Field of the Invention

The invention relates to an optical sensor. In particular, the invention relates to a reading head utilizing the optical sensor for reading out contents printed on a printed product such as a news paper which is fed in a direction. The invention also relates to a reading head utilizing the optical sensor for reading out contents formed on a printing plate for printing, the printing plate being fed in a direction.

2. Description of Related Art

There has been proposed a reading head for reading out contents printed on a printed product which is fed in a direction, as disclosed in Japanese Laid-Open Patent Publication No. 156,080 of 1997. The reading head includes a circuit board extending in a direction vertical to the feeding direction of the printed product. The reading head further includes a plurality of optical sensors arranged in line longitudinally of the circuit board.

Each of the optical sensors includes LEDs which are fixedly mounted on and electrically connected with the circuit board by soldering to complete a first electronic circuit through the LEDs. The LEDs are energized by the first electronic circuit for directing a light onto the printed product to illuminate the printed product with the light and generate a reflected light reflected from the printed product. Each of the optical sensors further includes photo detecting means comprising a photo diode array which is also fixedly mounted on and electrically connected with the circuit board by soldering to complete a second electronic circuit through the photo detecting means. The photo detecting means is energized by the second electronic circuit for receiving and detecting the reflected light reflected from the printed product to read out the contents printed on the printed product.

By the way, the LEDs or the photo detecting means may be damaged by accident in each of the optical sensors. In the case, the LEDs or the photo detecting means has to be exchanged for new one, otherwise the reading head can not satisfactorily read out the contents printed on the printed product. However, the reading head is problematic in that the LEDs or the photo detecting means is difficult to be exchanged for new one because it is fixedly mounted on the circuit board by soldering. Even if the LEDs or the photo detecting means can be forcibly removed from the circuit board, the new one must then be carefully mounted on the circuit board by soldering to obtain a precision in position and angle of the LEDs and the photo detecting means with respect to the circuit board. In particular, the photo detecting means would receive and detect the reflected light at a light receiving and detecting amount which varies with the angle of the photo detecting means. It is therefore required to make the angle of the photo detecting means in each of the optical sensors to be constant so that the photo detecting means can receive and detect the reflected light without difference in light receiving and detecting amount between the optical sensors to precisely read out the contents printed on the printed product. This involves labour, time, special tools or jigs and skillfulness to be impractical. Accordingly, all the reading head is commonly obliged to be exchanged for new one whenever the LEDs or the photo detecting means is damaged by accident in each of the optical sensors, resulting in expense.

It is therefore an object of the invention to provide a new and improved optical sensor, to overcome the above problems.

Other object of the invention is to provide the optical sensor in which LEDs or photo detecting means can be exchanged for new one without difficulty.

Other object of the invention is to obtain a precision in position and angle of the LEDs and the photo detecting means after exchange.

SUMMARY OF THE INVENTION

According to the invention, there is provided an optical sensor comprising a holder provided on a circuit board. The holder has first and second cavity means formed therein.

The optical sensor further comprises first body means including LEDs combined therewith for directing a light onto an object to illuminate the object with the light and generate a reflected light reflected from the object. The first body means is of a cassette type adapted to be fitted into and held in the first cavity means of the holder for removal. The first body means is electrically connected with the circuit board to complete a first electronic circuit through the LEDs when fitted into the first cavity means.

The optical sensor further comprises second body means including photo detecting means combined therewith for receiving and detecting the reflected light reflected from the object. The second body means is of a cassette type adapted to be fitted into and held in the second cavity means of the holder for removal. The second body means is electrically connected with the circuit board to complete a second electronic circuit through the photo detecting means when fitted into the second cavity means.

The object may comprise a printed product including contents printed thereon. The optical sensor may be intended to read out the contents of the printed product.

The object may comprise a printing plate including contents formed thereon for printing. The optical sensor may be intended to read out the contents of the printing plate.

In a preferred embodiment, the first cavity means is formed in the holder to have a depth in a direction toward the circuit board. The second cavity means is also formed in the holder to have a depth in the direction toward the circuit board. The first and second body means are inserted and fitted into the first and second cavity means in the direction toward the circuit board.

In addition, the first and second cavity means are formed in the holder side by side to extend parallel to each other along the circuit board. The first and second body means are held in the first and second cavity means side by side to extend parallel to each other along the circuit board.

The second cavity means comprises two second cavities formed in the holder. The first cavity means comprises a first cavity formed in the holder to be interposed between the second cavities. The second body means comprises two second bodies held in the second cavities. The first body means comprises a first body held in the first cavity to be interposed between the second bodies.

The first body includes a plurality of LEDs combined therewith and arranged in line longitudinally of the first body.

The LEDs comprise white LEDs for directing a white light onto the object to illuminate the object with the white light. The photo detecting means comprises photo transistors for receiving and detecting the reflected light reflected from the object.

The circuit board includes board terminal means formed therein at a position corresponding to the holder. The holder includes a bottom surface opposed to the circuit board and first and second through hole means formed in the bottom surface. The first body means further includes first terminal means and first conductor means combined with the first body means. The first terminal means is electrically connected with the LEDs by the first conductor means in the first body means. The first terminal means is inserted into the first through hole means to pass through the first through hole means when the first body means is fitted into the first cavity means. The second body means further includes second terminal means and second conductor means combined with the second body means. The second terminal means is electrically connected with the photo detecting means by the second conductor means in the second body means. The second terminal means is inserted into the second through hole means to pass through the second through hole means when the second body means is fitted into the second cavity means. The first and second terminal means protrude toward and contact with the board terminal means to complete the first and second electronic circuits respectively.

Furthermore, the first body means comprises split body means made of ultrasonically weldable material and split into two portions along a first split plane extending longitudinally of the first body means and transversely to the circuit board. The portions of the first body means include first recess means formed thereon along the first split plane for accommodating the first terminal means and the first conductor means. The portions of the first body means are ultrasonically welded to each other so that the first terminal means and the first conductor means can be sandwiched between the portions of the first body means to be combined therewith. The LEDs are disposed in position along the first split line and engaged and combined with the first body means to protrude therefrom. The second body means comprises split body means made of ultrasonically weldable material and split into two portions along a second split plane extending longitudinally of the second body means and transversely to the circuit board. The portions of the second body means include second recess means formed thereon along the second split plane for accommodating the photo detecting means, the second terminal means and the second conductor means. The portions of the second body means are ultrasonically welded to each other so that the photo detecting means, the second terminal means and the second conductor means can be sandwiched between the portions of the second body means to be combined therewith.

The LEDs, the first terminal means and the first conductor means may be ultrasonically welded to the first body means to be combined therewith. The photo detecting means, the second terminal means and the second conductor means may also be ultrasonically welded to the second body means to be combined therewith.

The first body means may include at least an electrical connection point formed between the LEDs, the first terminal means and the first conductor means. The second body means may include at least an electrical connection point formed between the photo detecting means, the second terminal means and the second conductor means. The electrical connection points may be ultrasonically welded to be electrically connected in the first and second body means.

An electrically conductive adhesive may be applied onto the electrical connection points in the first and second body means to keep the electrical connection points being electrically connected.

The first body means may further include first resistor means combined therewith. In the embodiment, the first terminal means is electrically connected with the LEDs and the first resistor means by the first conductor means in the first body means to complete the first electronic circuit through the LEDs and the first resistor means. The second body means may further include second resistor means combined therewith. In the embodiment, the second terminal means is electrically connected with the photo detecting means and the second resistor means by the second conductor means in the second body means to complete the second electronic circuit through the photo detecting means and the second resistor means.

In the embodiment, the first recess means is formed on the portions of the first body means along the first split plane for accommodating the first terminal means, the first conductor means and the first resistor means. The portions of the first body means are ultrasonically welded to each other so that the first terminal means, the first conductor means and the first resistor means can be sandwiched between the portions of the first body means to be combined therewith. The second recess means is formed on the portions of the second body means along the second split plane for accommodating the photo detecting means, the second terminal means, the second conductor means and the second resistor means. The portions of the second body means are ultrasonically welded to each other so that the photo detecting means, the second terminal means, the second conductor means and the second resistor means can be sandwiched between the portions of the second body means to be combined therewith.

The first resistor means may be ultrasonically welded to the first body means to be combined therewith. The second resistor means may be ultrasonically welded to the second body means to be combined therewith.

The first body means may include at least an electrical connection point formed between the LEDs, the first terminal means, the first conductor means and the first resistor means. The second body means may include at least an electrical connection point formed between the photo detecting means, the second terminal means, the second conductor means and the second resistor means. The electrical connection points may be ultrasonically welded to be electrically connected in the first and second body means.

An electrically conductive adhesive may be applied onto the electrical connection points in the first and second body means to keep the electrical connection points being electrically connected.

Each of the first and second body means may further include side surface means extending longitudinally of the first and second body means and transversely to the circuit board. The first body means may further include first radiator hole means formed in the side surface means thereof at a position corresponding to the first resistor means for radiating heat caused by the first resistor means. The second body means may further include second radiator hole means formed in the side surface means thereof at a position corresponding to the second resistor means for radiating heat caused by the second resistor means.

The first and second cavity means may be separated by partition means extending therebetween.

In the embodiment, the first body means may include opposite side surfaces extending longitudinally thereof and transversely to the circuit board. The first cavity means may include opposite inner surfaces opposed to the opposite side surfaces of the first body means with clearances formed therebetween. The second body means may include opposite side surfaces extending longitudinally thereof and transversely to the circuit board. The second cavity means may include opposite inner surfaces opposed to the opposite side surfaces of the second body means with clearances formed therebetween.

The clearances may be formed by additional means formed on the opposite inner surfaces of the first and second cavity means. The additional means may comprise elongated raised means formed on the opposite inner surfaces of the first and second cavity means to extend in the direction in which the first and second body means are inserted and fitted into the first and second cavity means.

The clearances may be formed by additional means formed on the opposite side surfaces of the first and second body means. The additional means may comprise elongated raised means formed on the opposite side surfaces of the first and second body means to extend in the direction in which the first and second body means are inserted and fitted into the first and second cavity means.

In other embodiment, one of the side surfaces of the first body means may be opposed to one of the side surfaces of the second body means with a clearance formed therebetween.

The holder may be fixedly mounted on the circuit board. The circuit board may include through hole means formed therein, the holder including pin means adapted to be inserted and fitted into the through hole means of the circuit board for positioning the holder when mounted on the circuit board.

The holder may include reflector surfaces formed thereon, the reflected light being reflected from the object toward the reflector surfaces and then reflected from the reflector surfaces toward the object.

There is also provided a reading head for reading out contents printed on a printed product which is fed in a direction. The reading head comprises the circuit board extending in a direction vertical to the feeding direction of the printed product. The reading head further comprises a linear sensor which comprises a plurality of optical sensors arranged in line longitudinally of the circuit board. Each of the optical sensors comprises the first body means which is of a cassette type adapted to be fitted into and held in the first cavity means of the holder for removal so that the first body means can be exchanged for new one. The optical sensor further comprises second body means which is of a cassette type adapted to be fitted into and held in the second cavity means of the holder for removal so that the second body means can be exchanged for new one.

There is also provided a reading head for reading out contents formed on a printing plate for printing, the printing plate being fed in a direction. The reading head comprises the circuit board extending in a direction vertical to the feeding direction of the printing plate. The reading head further comprises a linear sensor which comprises a plurality of optical sensors arranged in line longitudinally of the circuit board. Each of the optical sensors comprises the first body means which is of a cassette type adapted to be fitted into and held in the first cavity means of the holder for removal so that the first body means can be exchanged for new one. The optical sensor further comprises the second body means which is of a cassette type adapted to be fitted into and held in the second cavity means of the holder for removal so that the second body means can be exchanged for new one.

DETAILED DESCRIPTION OF THE PREFERRED EMBODIMENTS

Figure 1:
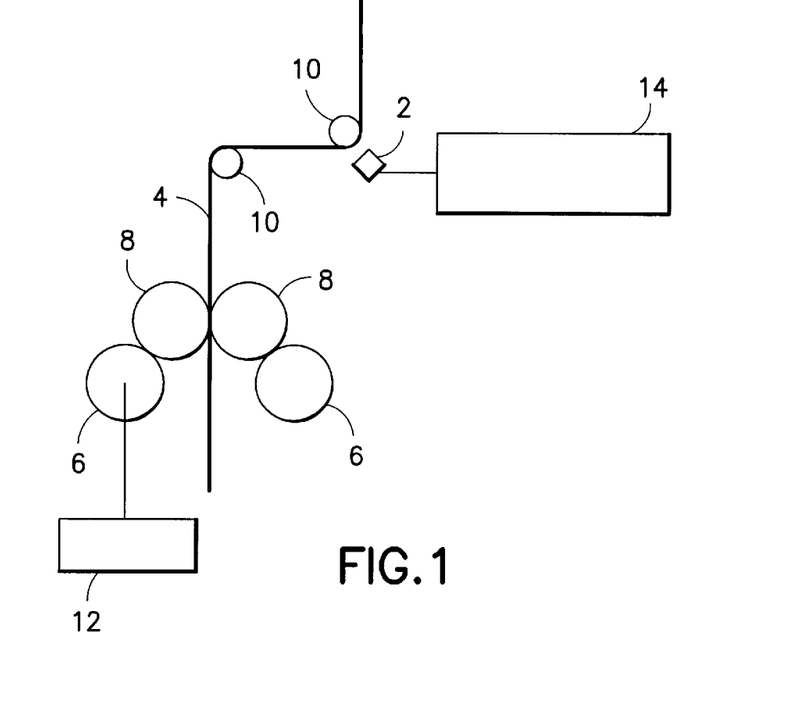
FIG. 1 is a schematic view of a preferred embodiment of the invention.

Turning now to the drawings, FIG. 1 illustrates a reading head 2 for reading out contents printed on a printed product 4. The printed product 4 comprises a news paper which is fed in a direction through a printing unit including plate cylinders 6 and blanket cylinders 8 so that the contents can be printed by the printing unit. The printed product 4 is then fed in the direction through guide rollers 10. The reading head 2 extends along the guide roller 10. The reading head 2 may be disposed in a position other than the position of the guide roller 10.

An encoder 12 is operatively connected to the plate cylinder 6 to generate pulses in accordance with the rotation of the plate cylinder 6. The reading head 2 is arranged to read out the contents printed on the printed product 4 in response to the pulses fed from the encoder 12. The encoder 12 may be operatively connected to the blanket cylinder 8 or guide roller 10 to generate pulses in accordance with the rotation of the blanket cylinder 8 or guide roller 10.

In addition, an inspecting apparatus 14 is electrically connected to the reading head 2 for inspecting the contents printed on the printed product 4 in accordance with the read out data transmitted from the reading head 2. The apparatus 14 is arranged to firstly store the read out data transmitted from the reading head 2 as reference data. The reading head 2 then reads out the contents printed on the printed product 4 again and again. The apparatus 14 stores the read out data transmitted from the reading head 2 as print data, whenever reading out the contents. The apparatus 14 then compares the print data with the reference data to inspect the contents printed on the printed product 4 about irregularity in print, excess and deficiency in ink density, discrepancy in color, contamination, partial lack of print and the like.

Figure 3:
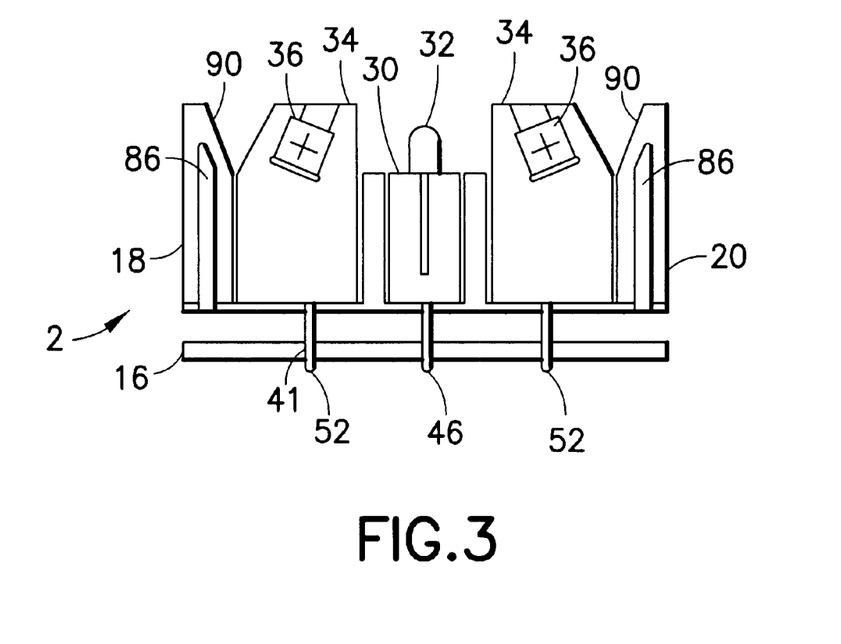
FIG. 3 is a cross sectional view of the optical sensor.

The reading head 2 includes a circuit board 16 which has a width, as shown in FIG. 3. The circuit board 16 extends in a direction vertical to the feeding direction of the printed product 4. The reading head 2 comprises a linear sensor which comprises a plurality of optical sensors 18 arranged in line longitudinally of the circuit board 16.

Figure 5:
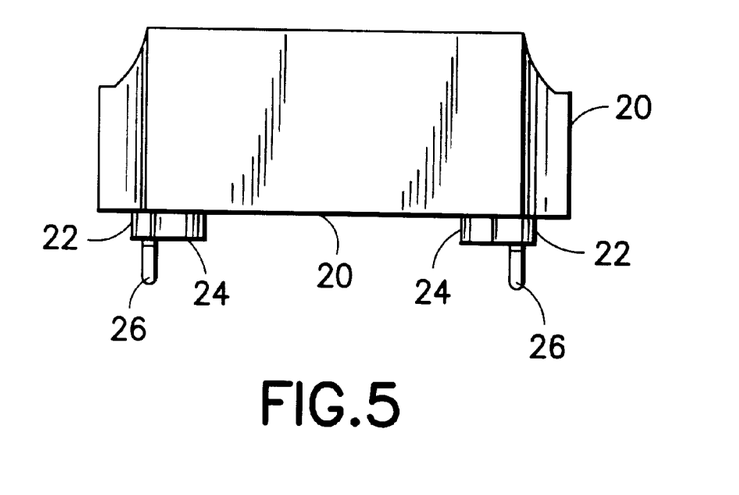
FIG. 5 is a side view of the holder.
Figure 6:
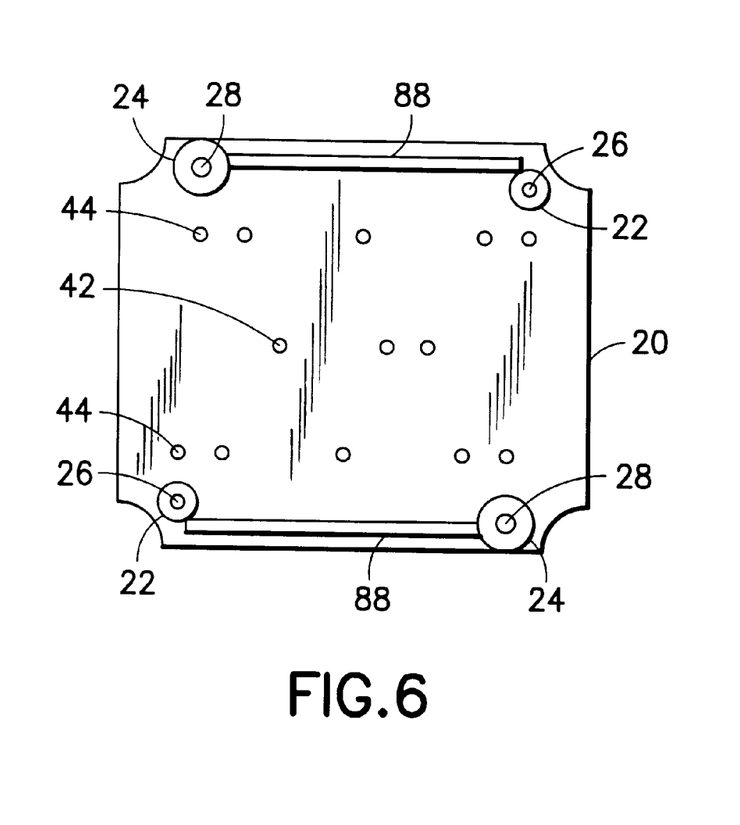
FIG. 6 is a bottom view of the holder.

Each of the optical sensors 18 comprises a holder 20 provided on the circuit board 16. In the embodiment, the holder 20 is fixedly mounted on the circuit board 16 by tapping screws not shown. In this connection, the holder 20 includes a bottom surface opposed to the circuit board 16, two pairs of spacers 22 and 24 being formed on the bottom surface to be positioned at four corners thereof, as shown in FIG. 5 and FIG. 6. The spacers 22 and 24 are engaged with the circuit board 16 to be sandwiched between the holder 20 and the circuit board 16. One of the pairs of spacers 22 are positioned diagonally of the bottom surface. The other pair of spacers 24 are also positioned diagonally of the bottom surface. In addition, the circuit board 16 includes through holes formed therein. The holder 20 further includes pins 26 formed on and protruding from one of the pairs of spacers 22. The pins 26 are adapted to be inserted and fitted into the through holes of the circuit board 16 for positioning the holder 20 when mounted on the circuit board 16. The holder 20 further includes complemental holes 28 formed in the other pair of spacers 24. The tapping screws are inserted and pushed into the complemental holes 28 of the spacers 24 through the through holes of the circuit board 16 and then turned in a direction to be threadedly engaged with the spacers 24 by tapping so that the holder 20 can be fixedly mounted on the circuit board 16 by the tapping screws and the spacers 22 and 24.

The optical sensor 18 further comprises first body means 30 including LEDs 32 combined therewith for directing a light onto the printed product 4 to illuminate the printed product 4 with the light and generate a reflected light reflected from the printed product 4. The optical sensor 18 further comprises second body means 34 including photo detecting means 36 combined therewith for receiving and detecting the reflected light reflected from the printed product 4 to read out the contents printed on the printed product 4.

Figure 4:
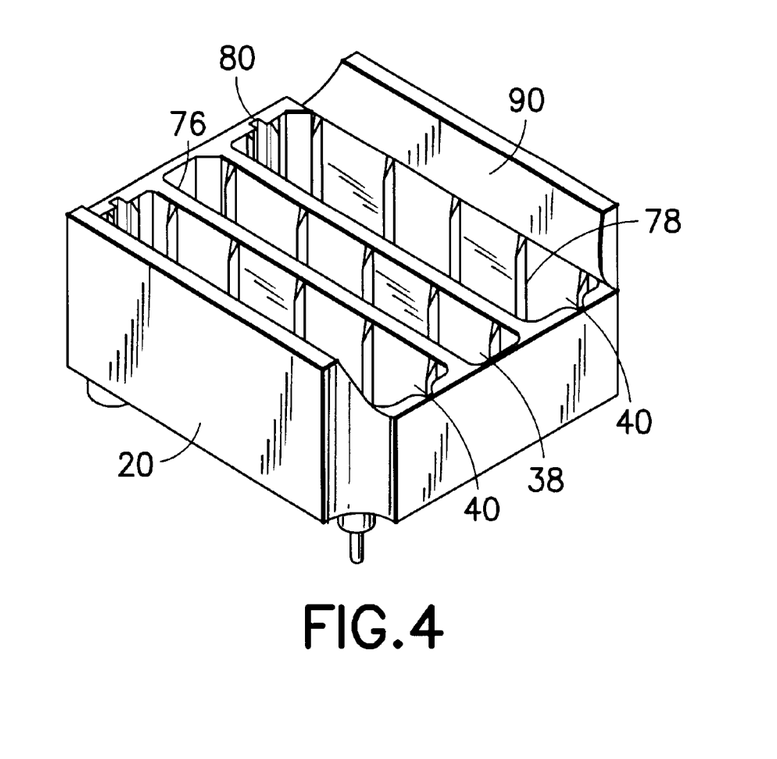
FIG. 4 is a perspective view of the holder in FIG. 2.

As to the holder 20 provided on the circuit board 16, the holder 20 has first and second cavity means 38 and 40 formed therein, as shown in FIG. 4. The first body means 30 is of a cassette type adapted to be fitted into and held in the first cavity means 38 of the holder 20 for removal so that the first body means 30 can be exchanged for new one. The first body means 30 is electrically connected with the circuit board 16 to complete a first electronic circuit through the LEDs 32 when fitted into the first cavity means 38. The second body means 34 is also of a cassette type adapted to be fitted into and held in the second cavity means 40 of the holder 20 for removal so that the second body means 34 can be exchanged for new one. The second body means 34 is electrically connected with the circuit board 16 to complete a second electronic circuit through the photo detecting means 36 when fitted into the second cavity means 40.

In the embodiment, the first cavity means 38 is formed in the holder 20 to have a depth in a direction toward the circuit board 16. The second cavity means 40 is also formed in the holder 20 to have a depth in the direction toward the circuit board 16. The first and second body means 30 and 34 are inserted and fitted into the first and second cavity means 38 and 40 in the direction toward the circuit board 16. The first and second body means 30 and 34 are then covered by a glass plate not shown. The glass plate may be engaged with the first and second body means 30 and 34 and the holder 20.

The first and second cavity means 38 and 40 are formed in the holder 20 side by side to extend parallel to each other along the circuit board 16. The first and second body means 30 and 34 are held in the first and second cavity means 38 and 40 side by side to extend parallel to each other along the circuit board 16.

Figure 14:
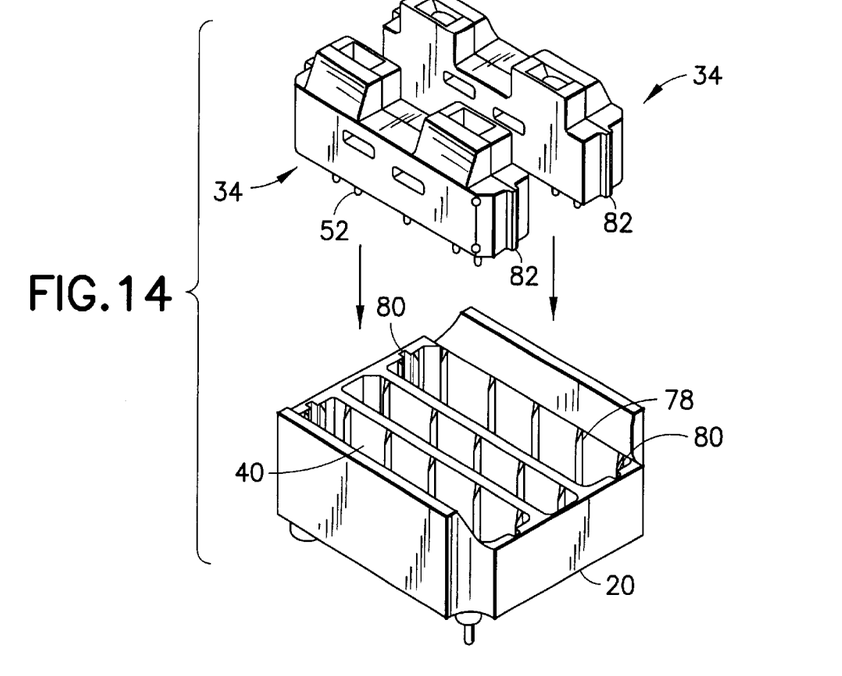
FIG. 14 is a perspective view illustrating the relative arrangement between the second bodies and the holder.
Figure 15:
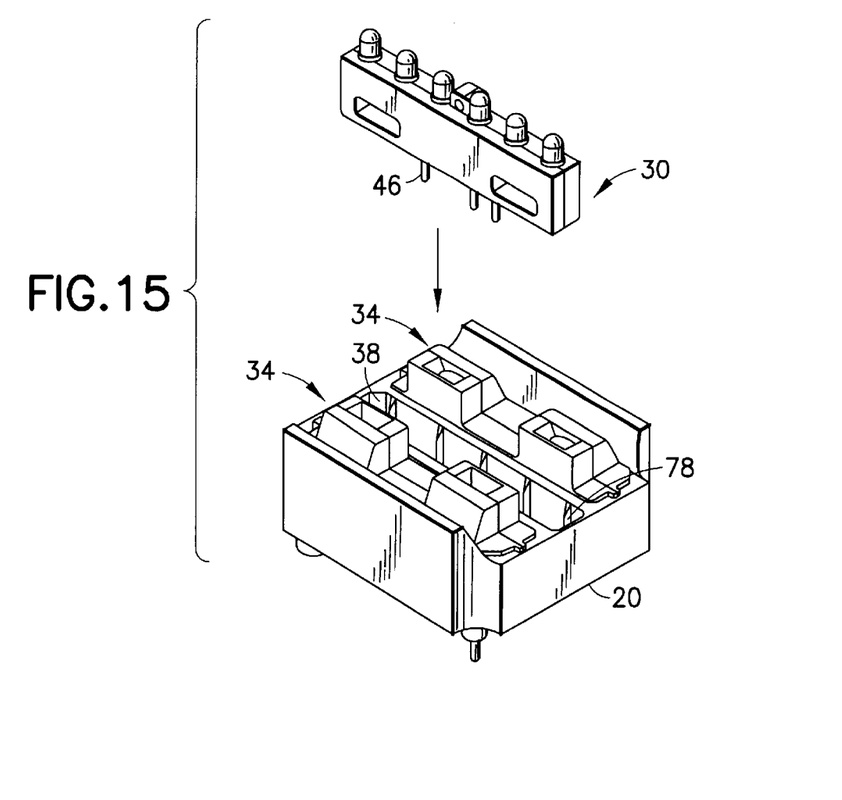
FIG. 15 is a perspective view illustrating the relative arrangement between the first body and the holder.

The second cavity means 40 comprises two second cavities formed in the holder 20. The first cavity means 38 comprises a first cavity formed in the holder 20 to be interposed between the second cavities 40. The second body means 34 comprises two second bodies fitted into and held in the second cavities 40, as shown in FIG. 14. The first body means 30 comprises a first body fitted into and held in the first cavity 38 to be interposed between the second bodies 34, as shown in FIG. 15.

Figure 2:
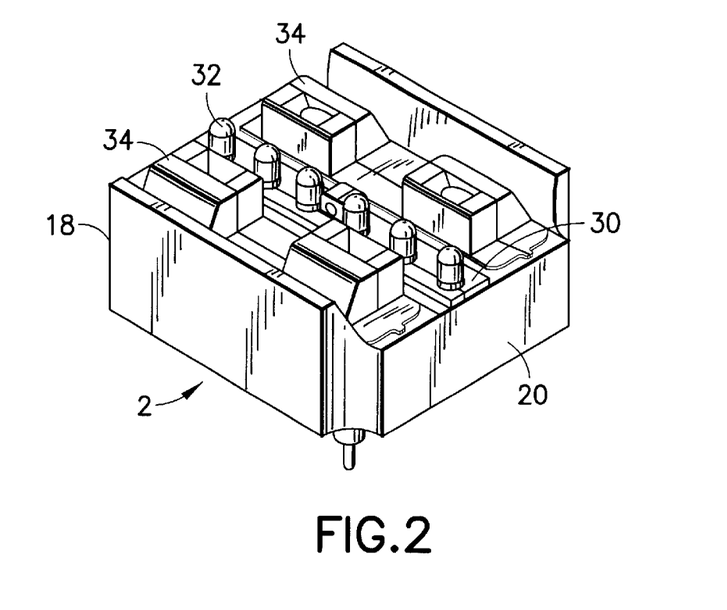
FIG. 2 is a perspective view of the optical sensor in FIG. 1.

The first body 30 includes a plurality of LEDs 32 combined therewith and arranged in line longitudinally of the first body 30, as shown in FIG. 2. The LEDs 32 comprise white LEDs for directing a white light onto the printed product 4 to illuminate the printed product 4 with the white light. The photo detecting means 36 comprises photo transistors for receiving and detecting the reflected light reflected from the printed product 4 to read out the contents printed on the printed product 4.

In addition, in the embodiment, the circuit board 16 includes board terminal means 41 comprising board terminal holes which are formed in the circuit board 16 at a position corresponding to the holder 20. The holder 20 includes first and second through holes 42 and 44 formed in the bottom surface thereof.

Figure 7:
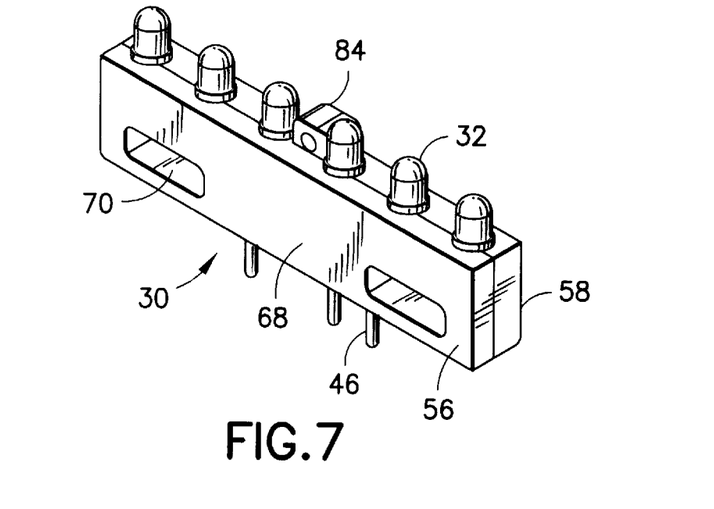
FIG. 7 is a perspective view of the first body in FIG. 2.
Figure 8:
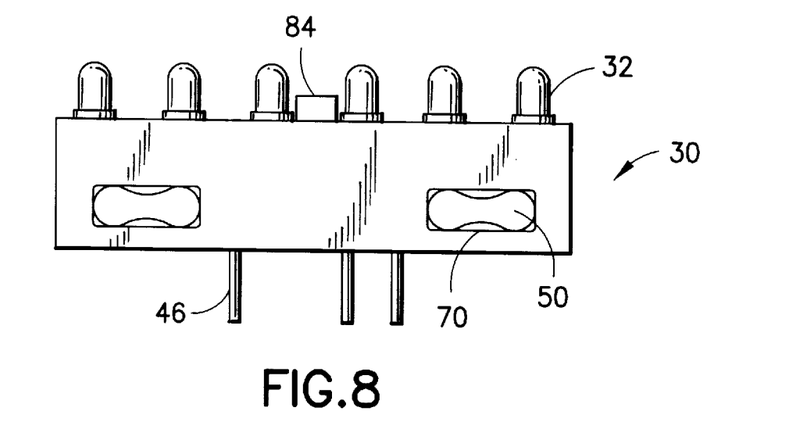
FIG. 8 is a side view of the first body.
Figure 13:
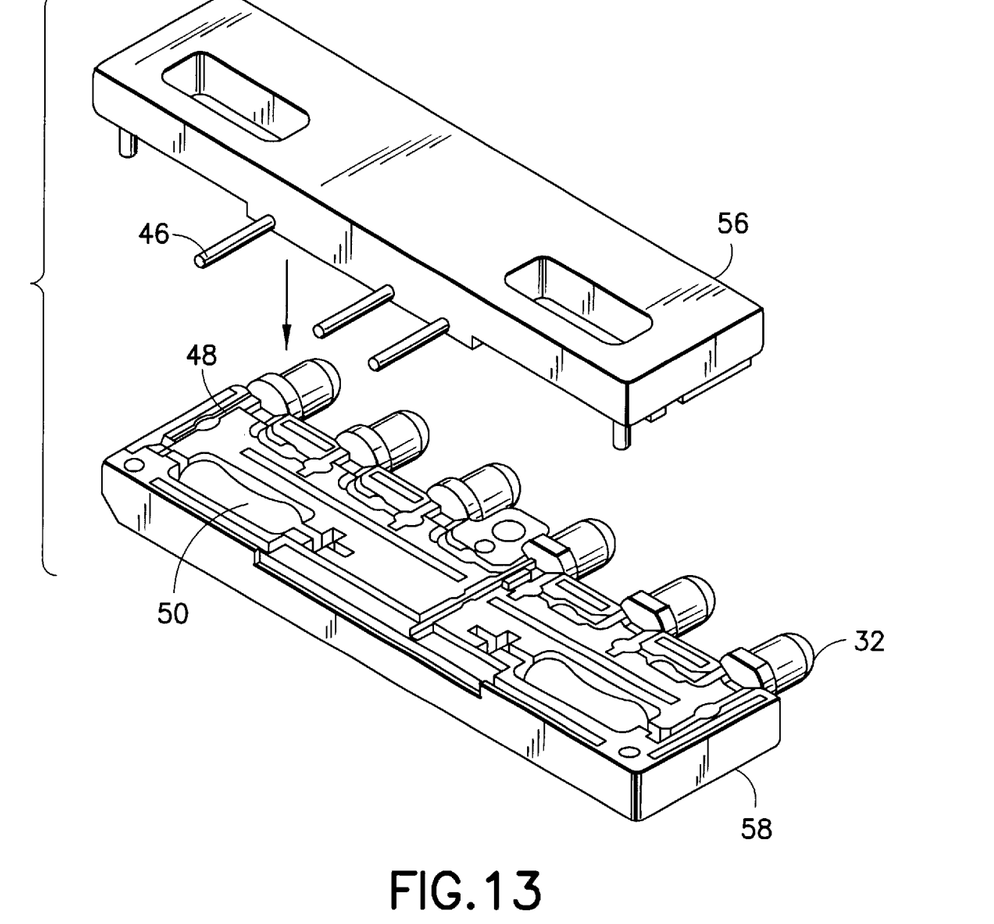
FIG. 13 is an explosive view of the first body.

The first body 30 further includes first terminal means 46, first conductors 48 and first resistors 50 combined with the first body 30, as shown in FIG. 7, FIG. 8 and FIG. 13. The first terminal means 46 comprises terminal pins which are electrically connected with the LEDs 32 and the first resistors 50 by the first conductors 48 in the first body 30 to complete the first electronic circuit through the LEDs 32 and the resistors 50. The first terminal pins 46 are inserted into the first through holes 42 of the holder 20 to pass through the first through holes 42 of the holder 20 and protrude toward and contact with the board terminal means 41 of the circuit board 16 to complete the first electronic circuit when the first body 30 is fitted into the first cavity 38. The first terminal pins 46 may contact with the board terminal means 41 by soldering.

Figure 10:
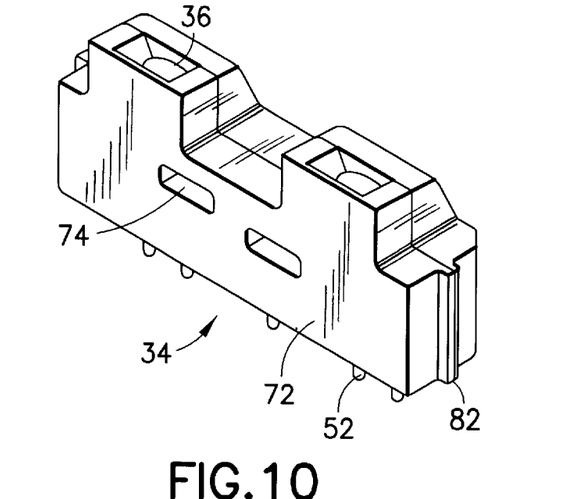
FIG. 10 is a perspective view of the second body in FIG. 2.
Figure 11:
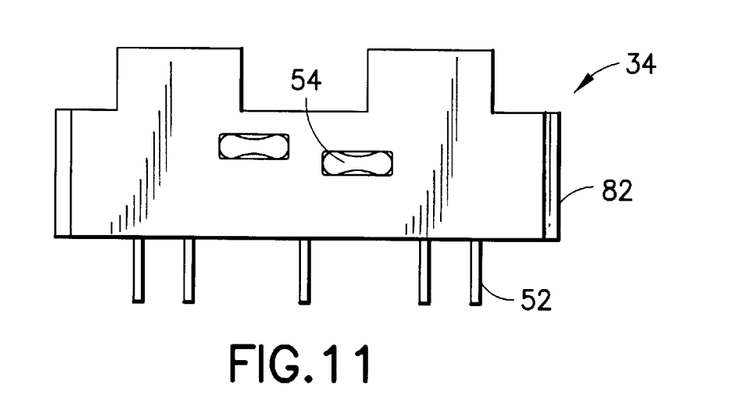
FIG. 11 is a side view of the second body.

On the other hand, each of the second bodies 34 further includes second terminal means 52, second conductors not shown and second resistors 54 combined with the second body 34, as shown in FIG. 10 and FIG. 11. The second terminal means 52 comprises second terminal pins which are electrically connected with the photo transistors 36 and the second resistors 54 by the second conductors in the second body 34 to complete the second electronic circuit through the photo transistors 36 and the second resistors 54. The second terminal pins 52 are inserted into the second through holes 44 of the holder 20 to pass through the second through holes 44 of the holder 20 and protrude toward and contact with the board terminal means 41 of the circuit board 16 to complete the second electronic circuit when the second body 34 is fitted into the second cavity 40. The second terminal pins 52 may contact with the board terminal means 41 by soldering.

Figure 9:
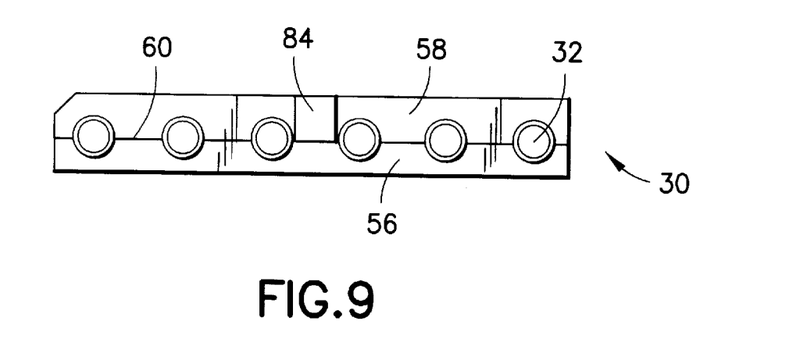
FIG. 9 is a plan view of the first body.

Furthermore, in the embodiment, the first body 30 comprises a split body made of ultrasonically weldable material and split into two portions 56 and 58 along a first split plane 60 extending longitudinally of the first body 30 and transversely to the circuit board 16, as shown in FIG. 9. The portions 56 and 58 of the first body 30 include first recess means formed thereon along the first split plane 60 for accommodating the first terminal pins 46, the first conductors 48 and the first resistors 50. The portions 56 and 58 of the first body 30 are ultrasonically welded to each other so that the first terminal pins 46, the first conductors 48 and the first resistors 50 can be sandwiched between the portions 56 and 58 of the first body 30 to be combined therewith. The LEDs 32 are disposed in position along the first split plane 60 and engaged and combined with the first body 30 to protrude therefrom.

Figure 12:
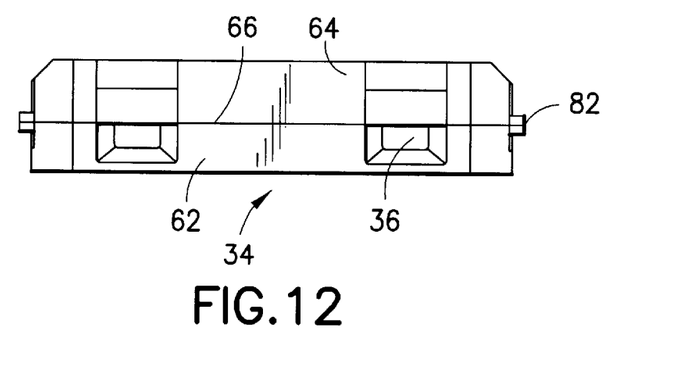
FIG. 12 is a plan view of the second body.

Each of the second bodies 34 also comprises a split body made of ultrasonically weldable material and split into two portions 62 and 64 along a second split plane 66 extending longitudinally of the second body 34 and transversely to the circuit board 16, as shown in FIG. 12. The portions 62 and 64 of the second body 34 include second recess means formed thereon along the second split plane 66 for accommodating the photo transistors 36, the second terminal pins 52, the second conductors and the second resistors 54. The portions 62 and 64 of the second body 34 are ultrasonically welded to each other so that the photo transistors 36, the second terminal pins 52, the second conductors and the second resistors 54 can be sandwiched between the portions 62 and 64 of the second body 34 to be combined therewith.

In the embodiment, the LEDs 32, the first terminal pins 46, the first conductors 48 and the first resistors 50 are ultrasonically welded to the first body 30 to be combined therewith. The photo transistors 36, the second terminal pins 52, the second conductors and the second resistors 54 are also ultrasonically welded to the second body 34 to be combined therewith.

The first body 30 includes at least an electrical connection point formed between the LEDs 32, the first terminal pins 46, the first conductors 48 and the first resistors 50. The second body 34 also includes at least an electrical connection point formed between the photo transistors 36, the second terminal pins 52, the second conductors and the second resistors 54. For example, the first terminal pins 46 are independent of the first conductors 48 before combined with the first body 30. In the case, the first terminal pins 46 are electrically connected with the first conductors 48 when combined with the first body 30. Accordingly, electrical connection points are formed between the first terminal pins 46 and the first conductors 48. The second terminal pins 52 are also independent of the second conductors before combined with the second body 34. In the case, the second terminal pins 52 are electrically connected with the second conductors when combined with the second body 34. Accordingly, electrical connection points are formed between the second terminal pins 52 and the second conductors. In the embodiment, the electrical connection points are ultrasonically welded to be electrically connected in the first and second bodies 30 and 34. In addition, an electrically conductive adhesive is applied onto the electrical connection points in the first and second bodies 30 and 34 to keep the electrical connection points being electrically connected.

In the embodiment, the first body 30 has a certain shape which includes opposite side surfaces 68 extending longitudinally of the first body 30 and transversely to the circuit board 16. The first body 30 further includes first radiator holes 70 formed in the side surfaces 68 thereof at positions corresponding to the first resistors 50 for radiating heat caused by the first resistors 50. The second body 34 also has a certain shape which includes opposite side surfaces 72 extending longitudinally of the second body 34 and transversely to the circuit board 16. The second body 34 further includes second radiator holes 74 formed in the side surfaces 72 thereof at positions corresponding to the second resistors 54 for radiating heat caused by the second resistors 54.

In addition, in the embodiment, the first and second cavities 38 and 40 are separated by partitions 76 extending therebetween so that the first cavity 38 includes opposite inner surfaces opposed to the opposite side surfaces 68 of the first body 30 with clearances formed therebetween. The second cavity 40 includes opposite inner surfaces opposed to the opposite side surfaces 72 of the second body 34 with clearances formed therebetween. The clearances are formed by additional means 78 formed on the opposite inner surfaces of the first and second cavities 38 and 40. The additional means 78 comprise elongated raised means formed on the opposite inner surfaces of the first and second cavities 38 and 40 to extend in the direction in which the first and second bodies 30 and 34 are inserted and fitted into the first and second cavities 38 and 40.

Each of the second cavities 40 includes elongated grooves 80 formed therein to extend in the direction in which the second body 34 is inserted and fitted into the second cavity 40. Each of the second bodies 34 includes elongated raised portions 82 formed thereon to be fitted into the elongated grooves 80 for positioning the second body 34 when inserted and fitted into the second cavity 40.

Accordingly, the first or second body 30 or 34 can be removed from the first or second cavity 38 or 40 without difficulty in each of the optical sensors 18 when the LEDs 32 or the photo transistors 36 are damaged by accident. New first or second body 30 or 34 can then be inserted and fitted into the first or second cavity 38 or 40 without difficulty. The first or second body 30 or 34 is electrically connected with the circuit board 16 to complete the first or second electronic circuit through the LEDs 32 and the first resistors 50 or the photo transistors 36 and the second resistors 54 when fitted into the first or second cavity 38 or 40. The LEDs 32 or the photo transistors 36 can therefore be exchanged for new ones without difficulty.

The first or second cavity 38 or 40 cooperates with the first and second body 30 or 34 to obtain a precision in position and angle of the LEDs 22 or the photo transistors 36 with respect to the circuit board 16 after exchange. In particular, the arrangement can make the angle of the photo transistors 36 in each of the optical sensors 2 to be constant so that the photo transistor 36 can receive and detect the reflected light without difference in light receiving and detecting amount between the optical sensors 2 to precisely read out the contents printed on the printed product 4.

In addition, as to heat caused by the first and second resistors 50 and 54 in the first and second bodies 30 and 34, the first and second radiator holes 70 and 74 cooperate with the clearances formed between the opposite side surfaces 68 and 72 of the first and second bodies 30 and 34 and the opposite inner surfaces of the first and second cavities 38 and 40 for providing air cooling. This arrangement can protect the elements combined with first and second bodies 30 and 34 from being damaged by the heat caused by the first and second resistors 50 and 54. In particular, it can protect the photo transistors 36 combined in the second bodies 34 from being changed in properties by the heat.

Accordingly, it is acceptable with no problem in the reading head 2 that the first and second resistors 50 and 54 are sandwiched between the portions 56, 58, 62 and 64 of the first and second bodies 30 and 34 to be combined therewith. The first and second resistors 50 and 54 are therefore not required to be combined with the circuit board 16. This makes the circuit board 16 to be simple in structure. The reading head 2 can therefore be compact.

As to heat caused by the LEDs 32 of the first body 30, the LEDs 32 protrude from the first body 30 for providing air cooling. This arrangement can protect the first body 30 from being damaged by the heat caused by the LEDs 32.

The first body 30 may include a handle 84 or the like formed thereon by which the first body 30 is removed from the first cavity 38. The holder 20 may include vacuities 86 formed therein and communicating with openings 88 formed in the bottom surface of the holder 20 for providing air cooling. The holder 20 may further include reflector surfaces 90 formed thereon so that the reflected light is reflected from the printed product 4 toward the reflector surfaces 90 and then reflected from the reflector surfaces 90 toward the printed product 4.

As to the clearances formed between the opposite side surfaces 68 and 72 of the first and second bodies 30 and 34 and the opposite inner surfaces of the first and second cavities 38 and 40, the clearances may be formed by additional means formed on the opposite side surfaces 68 and 72 of the first and second bodies 30 and 34. The additional means may comprise elongated raised means formed on the opposite side surfaces 68 and 72 of the first and second bodies 30 and 34 to extend in the direction in which the first and second bodies 30 and 34 are inserted and fitted into the first and second cavities 38 and 40.

As to the partitions 76 by which the first and second cavities 38 and 40 are separated, the partitions may comprise partial partitions so that at least one of the side surfaces 68 of the first body 30 is opposed to one of the side surfaces 72 of the second body 34 with a clearance formed therebetween. The opposite side surfaces 68 of the first body 30 may be opposed to ones of the side surfaces 72 of the second bodies 34 with clearances formed therebetween. Each of the second cavities 40 may include an inner surface opposed to the other side surface 72 of the second body 34 with a clearance formed therebetween.

What is claimed:

1. An optical sensor comprising:
    a holder provided on a circuit board, the holder having first and second cavity means formed therein;
    first body means including LEDs combined therewith for directing a light onto an object to illuminate the object with the light and generate a reflected light reflected from the object, the first body means comprising a cassette which is fitted into and held in the first cavity means of the holder for removal, the first body means being electrically connected with the circuit board to complete a first electronic circuit through the LEDs when fitted into the first cavity means; and
    second body means including photo detecting means combined therewith for receiving and detecting the reflected light reflected from the object, the second body means comprising a cassette which is fitted into and held in the second cavity means of the holder for removal, the second body means being electrically connected with the circuit board to complete a second electronic circuit through the photo detecting means when fitted into the second cavity means,
    wherein the object comprises a printed product including contents printed thereon, the optical sensor being intended to read out the contents of the printed product.

2. An optical sensor comprising:
    a holder provided on a circuit board, the holder having first and second cavity means formed therein;
    first body means including LEDs combined therewith for directing a light onto an object to illuminate the object with the light and generate a reflected light reflected from the object, the first body means comprising a cassette which is fitted into and held in the first cavity means of the holder for removal, the first body means being electrically connected with the circuit board to complete a first electronic circuit through the LEDs when fitted into the first cavity means; and
    second body means including photo detecting means combined therewith for receiving and-detecting the reflected light reflected from the object, the second body means comprising a cassette which is fitted into and held in the second cavity means of the holder for removal, the second body means being electrically connected with the circuit board to complete a second electronic circuit through the photo detecting means when fitted into the second cavity means,
    wherein the object comprises a printing plate including contents formed thereon for printing, the optical sensor being intended to read out the contents of the printing plate.

3. The optical sensor as set forth in claim 1 or 2 wherein the first cavity means is formed in the holder to have a depth in a direction toward the circuit board, the second cavity means being formed in the holder to have a depth in the direction toward the circuit board, the first and second body means being inserted and fitted into the first and second cavity means in the direction toward the circuit board.

4. The optical sensor as set forth in claim 3 wherein the first and second cavity means are formed in the holder side by side to extend parallel to each other along the circuit board, the first and second body means being held in the first and second cavity means side by side to extend parallel to each other along the circuit board.

5. The optical sensor as set forth in claim 4 wherein the second cavity means comprises two second cavities formed in the holder, the first cavity means comprising a first cavity formed in the holder to be interposed between the second cavities, the second body means comprising two second bodies held in the second cavities, the first body means comprising a first body held in the first cavity to be interposed between the second bodies.

6. The optical sensor as set forth in claim 5 wherein the first body includes a plurality of LEDs combined therewith and arranged in line longitudinally of the first body.

7. The optical sensor as set forth in claim 6 wherein the LEDs comprise white LEDs for directing a white light onto the object to illuminate the object with the white light, the photo detecting means comprising photo transistors for receiving and detecting the reflected light reflected from the object.

8. The optical sensor as set forth in claim 4 wherein the circuit board includes board terminal means formed therein at a position corresponding to the holder, the holder including a bottom surface opposed to the circuit board and first and second through hole means formed in the bottom surface, the first body means further including first terminal means and first conductor means combined with the first body means, the first terminal means being electrically connected with the LEDs by the first conductor means in the first body means, the first terminal means being inserted into the first through hole means to pass through the first through hole means when the first body means is fitted into the first cavity means, the second body means further including second terminal means and second conductor means combined with the second body means, the second terminal means being electrically connected with the photo detecting means by the second conductor means in the second body means, the second terminal means being inserted into the second through hole means to pass through the second through hole means when the second body means is fitted into the second cavity means, the first and second terminal means protruding toward and contacting with the board terminal means to complete the first and second electronic circuits respectively.

9. The optical sensor as set forth in claim 8 wherein the first body means comprises split body means made of ultrasonically weldable material and split into two portions along a first split plane extending longitudinally of the first body means and transversely to the circuit board, the portions of the first body means including first recess means formed thereon along the first split plane for accommodating the first terminal means and the first conductor means, the portions of the first body means being ultrasonically welded to each other so that the first terminal means and the first conductor means can be sandwiched between the portions of the first body means to be combined therewith, the LEDs being disposed in position along the first split line and engaged and combined with the first body means to protrude therefrom, the second body means comprising split body means made of ultrasonically weldable material and split into two portions along a second split plane extending longitudinally of the second body means and transversely to the circuit board, the portions of the second body means including second recess means formed thereon along the second split plane for accommodating the photo detecting means, the second terminal means and the second conductor means, the portions of the second body means being ultrasonically welded to each other so that the photo detecting means, the second terminal means and the second conductor means can be sandwiched between the portions of the second body means to be combined therewith.

10. The optical sensor as set forth in claim 9 wherein the LEDs, the first terminal means and the first conductor means are ultrasonically welded to the first body means to be combined therewith, the photo detecting means, the second terminal means and the second conductor means being ultrasonically welded to the second body means to be combined therewith.

11. The optical sensor as set forth in claim 9 wherein the first body means includes at least an electrical connection point formed between the LEDs, the first terminal means and the first conductor means, the second body means including at least an electrical connection point formed between the photo detecting means, the second terminal means and the second conductor means, the electrical connection points being ultrasonically welded to be electrically connected in the first and second body means.

12. The optical sensor as set forth in claim 11 wherein an electrically conductive adhesive is applied onto the electrical connection points in the first and second body means to keep the electrical connection points being electrically connected.

13. The optical sensor as set forth in claim 8 wherein the first body means further includes first resistor means combined therewith, the first terminal means being electrically connected with the LEDs and the first resistor means by the first conductor means in the first body means to complete the first electronic circuit through the LEDs and the first resistor means, the second body means further including second resistor means combined therewith, the second terminal means being electrically connected with the photo detecting means and the second resistor means by the second conductor means in the second body means to complete the second electronic circuit through the photo detecting means and the second resistor means.

14. The optical sensor as set forth in claim 13 wherein the first body means comprises split body means made of ultrasonically weldable material and split into two portions along a first split plane extending longitudinally of the first body means and transversely to the circuit board, the portions of the first body means including first recess means formed thereon along the first split plane for accommodating the first terminal means, the first conductor means and the first resistor means, the portions of the first body means being ultrasonically welded to each other so that the first terminal means, the first conductor means and the first resistor means can be sandwiched between the portions of the first body means to be combined therewith, the LEDs being disposed in position along the first split line and engaged and combined with the first body means to protrude therefrom, the second body means comprising split body means made of ultrasonically weldable material and split into two portions along a second split plane extending longitudinally of the second body means and transversely to the circuit board, the portions of the second body means including second recess means formed thereon along the second split plane for accommodating the photo detecting means, the second terminal means, the second conductor means and the second resistor means, the portions of the second body means being ultrasonically welded to each other so that the photo detecting means, the second terminal means, the second conductor means and the second resistor means can be sandwiched between the portions of the second body means to be combined therewith.

15. The optical sensor as set forth in claim 14 wherein the LEDs, the first terminal means, the first conductor means and the first resistor means are ultrasonically welded to the first body means to be combined therewith, the photo detecting means, the second terminal means, the second conductor means and the second resistor means being ultrasonically welded to the second body means to be combined therewith.

16. The optical sensor as set forth in claim 14 wherein the first body means includes at least an electrical connection point formed between the LEDs, the first terminal means, the first conductor means and the first resistor means, the second body means including at least an electrical connection point formed between the photo detecting means, the second terminal means, the second conductor means and the second resistor means, the electrical connection points being ultrasonically welded to be electrically connected in the first and second body means.

17. The optical sensor as set forth in claim 16 wherein an electrically conductive adhesive is applied onto the electrical connection points in the first and second body means to keep the electrical connection points being electrically connected.

18. The optical sensor as set forth in claim 13 wherein each of the first and second body means further includes side surface means extending longitudinally of the first and second body means and transversely to the circuit board, the first body means further including first radiator hole means formed in the side surface means thereof at a position corresponding to the first resistor means for radiating heat caused by the first resistor means, the second body means further including second radiator hole means formed in the side surface means thereof at a position corresponding to the second resistor means for radiating heat caused by the second resistor means.

19. The optical sensor as set forth in claim 4 wherein the first and second cavity means are separated by partition means extending therebetween.

20. The optical sensor as set forth in claim 19 wherein the first body means includes opposite side surfaces extending longitudinally thereof and transversely to the circuit board, the first cavity means including opposite inner surfaces opposed to the opposite side surfaces of the first body means with clearances formed therebetween, the second body means including opposite side surfaces extending longitudinally thereof and transversely to the circuit board, the second cavity means including opposite inner surfaces opposed to the opposite side surfaces of the second body means with clearances formed therebetween.

21. The optical sensor as set forth in claim 20 wherein the clearances are formed by additional means formed on the opposite inner surfaces of the first and second cavity means.

22. The optical sensor as set forth in claim 21 wherein the additional means comprises elongated raised means formed on the opposite inner surfaces of the first and second cavity means to extend in the direction in which the first and second body means are inserted and fitted into the first and second cavity means.

23. The optical sensor as set forth in claim 20 wherein the clearances are formed by additional means formed on the opposite side surfaces of the first and second body means.

24. The optical sensor as set forth in claim 23 wherein the additional means comprises elongated raised means formed on the opposite side surfaces of the first and second body means to extend in the direction in which the first and second body means are inserted and fitted into the first and second cavity means.

25. The optical sensor as set forth in claim 4 wherein the first body means includes opposite side surfaces extending longitudinally thereof and transversely to the circuit board, the second body means including opposite side surfaces extending longitudinally thereof and transversely to the circuit board, one of the side surfaces of the first body means being opposed to one of the side surfaces of the second body means with a clearance formed therebetween.

26. The optical sensor as set forth in claim 4 wherein the holder is fixedly mounted on the circuit board, the circuit board including through hole means formed therein, the holder including pin means adapted to be inserted and fitted into the through hole means of the circuit board for positioning the holder when mounted on the circuit board.

27. The optical sensor as set forth in claim 4 wherein the holder including reflector surfaces formed thereon, the reflected light being reflected from the object toward the reflector surfaces and then reflected from the reflector surfaces toward the object.

28. A reading head for reading out contents printed on a printed product which is fed in a direction, the reading head comprising a circuit board extending in a direction vertical to the feeding direction of the printed product, the reading head further comprising a linear sensor which comprises a plurality of optical sensors arranged in line longitudinally of the circuit board, each of the optical sensors comprising:

a holder provided on the circuit board, the holder having first and second cavity means formed therein;

first body means including LEDs combined therewith for directing a light onto the printed product to illuminate the printed product with the light and generate a reflected light reflected from the printed product, the first body means comprising a cassette which is fitted into and held in the first cavity means of the holder for removal so that the first body means can be exchanged for new one, the first body means being electrically connected with the circuit board to complete a first electronic circuit through the LEDs when fitted into the first cavity means; and second body means including photo detecting means combined therewith for receiving and detecting the reflected light reflected from the printed product, the second body means comprising a cassette which is fitted into and held in the second cavity means of the holder for removal so that the second body means can be exchanged for new one, the second body means being electrically connected with the circuit board to complete a second electronic circuit through the photo detecting means when fitted into the second cavity means.

29. A reading head for reading out contents formed on a printing plate for printing, the printing plate being fed in a direction, the reading head comprising a circuit board extending in a direction vertical to the feeding direction of the printing plate, the reading head further comprising a linear sensor which comprises a plurality of optical sensors arranged in line longitudinally of the circuit board, each of the optical sensors comprising:

a holder provided on the circuit board, the holder having first and second cavity means formed therein;

first body means including LEDs combined therewith for directing a light onto an object to illuminate the printing plate with the light and generate a reflected light reflected from the printing plate, the first body means comprising a cassette which is fitted into and held in the first cavity means of the holder for removal so that the first body means can be exchanged for new one, the first body means being electrically connected with the circuit board to complete a first electronic circuit through the LEDs when fitted into the first cavity means; and second body means including photo detecting means combined therewith for receiving and detecting the reflected light reflected from the printing plate, the second body means comprising a cassette which is fitted into and held in the second cavity means of the holder for removal so that the second body means can be exchanged for new one, the second body means being electrically connected with the circuit board to complete a second electronic circuit through the photo detecting means when fitted into the second cavity means.

* * * * *